(12) United States Patent
Murayama et al.

(10) Patent No.: US 6,538,487 B2
(45) Date of Patent: Mar. 25, 2003

(54) ELECTRICAL CIRCUIT HAVING INVERTERS BEING SERIALLY CONNECTED TOGETHER IN A CASCADE

(75) Inventors: Hidehisa Murayama, Tokyo (JP); Hiroyuki Yamada, Tokyo (JP)

(73) Assignee: Electric Industry Co., Ltd., Tokyo (JP)

( * ) Notice: Subject to any disclaimer, the term of this patent is extended or adjusted under 35 U.S.C. 154(b) by 0 days.

(21) Appl. No.: 09/899,948

(22) Filed: Jul. 9, 2001

(65) Prior Publication Data

US 2002/0021161 A1 Feb. 21, 2002

Related U.S. Application Data (63) Continuation of application No. 09/521,421, filed on Mar. 8, 2000, now abandoned.

(30) Foreign Application Priority Data

Jul. 23, 1999 (JP) .......................................... 11-209801

(51) Int. Cl.[7] .............................................. H03H 11/16
(52) U.S. Cl. ...................... 327/232; 327/283; 327/284
(58) Field of Search ................................. 327/231, 232, 327/269, 283, 284

(56) References Cited

U.S. PATENT DOCUMENTS

| | | | | |
|---|---|---|---|---|
| 3,942,081 A | * | 3/1976 | Liska et al. ..................... | 318/7 |
| 4,015,224 A | * | 3/1977 | Benzinger .................... | 327/557 |
| 4,147,989 A | * | 4/1979 | Brolde ........................ | 327/363 |
| 4,177,428 A | * | 12/1979 | Klank ......................... | 325/455 |
| 4,280,212 A | | 7/1981 | Ransom et al. ............... | 368/82 |
| 4,763,025 A | | 8/1988 | Takeuchi ..................... | 327/45 |
| 4,943,770 A | * | 7/1990 | Ashley-Rollman et al. ...... | 324/207.17 |
| 5,180,991 A | | 1/1993 | Takashima ................... | 331/1 A |
| 5,617,563 A | | 4/1997 | Banerjee et al. ............ | 713/501 |

OTHER PUBLICATIONS

Yamada et al.; *Low Power Limiting Amplifier with 0.2 μm MESFET for High Speed Optical Fiber Systems*; "General Meeting of the Electronic Information Communication Society"; 1998; p. 106.

* cited by examiner

*Primary Examiner*—Kenneth B. Wells
(74) *Attorney, Agent, or Firm*—Rabin & Berdo, P.C.

(57) ABSTRACT

In the case where the amplitude of the input signal is large, the duty ratio of the signal output from the last stage is greatly changed as compared with the input signal. In the present invention, in order to solve this problem, there is provided a cascade connection type inverter circuit in which the inverters at the odd-number stage is fed back to the input circuit of the inverter at the first stage via an impedance element, the circuit being characterized in that a switching means is connected for supplying to an input circuit of the inverter at the first stage a compensation current for compensating a disparity between the logical threshold value of the inverter at the first stage and the central voltage of the input signal when the voltage generated between the output terminal of the inverter at the first stage and the input terminal thereof exceeds a predetermined threshold value level.

20 Claims, 8 Drawing Sheets

INPUT WAVEFORM OF THE INVERTER AT THE SECOND STAGE

ELECTRICAL CIRCUIT HAVING INVERTERS BEING SERIALLY CONNECTED TOGETHER IN A CASCADE

This application is a continuation of application Ser. No. 09/521,421, filed Mar. 8, 2000, abandoned the disclosure of which is incorporated herein by reference.

BACKGROUND OF THE INVENTION

1. Field of the Invention

The present invention relates to a cascade connection type inverter circuit used in a semiconductor integrated circuit. Additionally, the present invention relates to a limiting amplifier using a cascade connection type inverter circuit in an input stage thereof.

2. Description of the Related Art

A conventional input circuit of a limiting amplifier is disclosed in "General Meeting of the Electronic Information Communication Society, Lecture Documents C-10-29", (1998).

Figure 2:
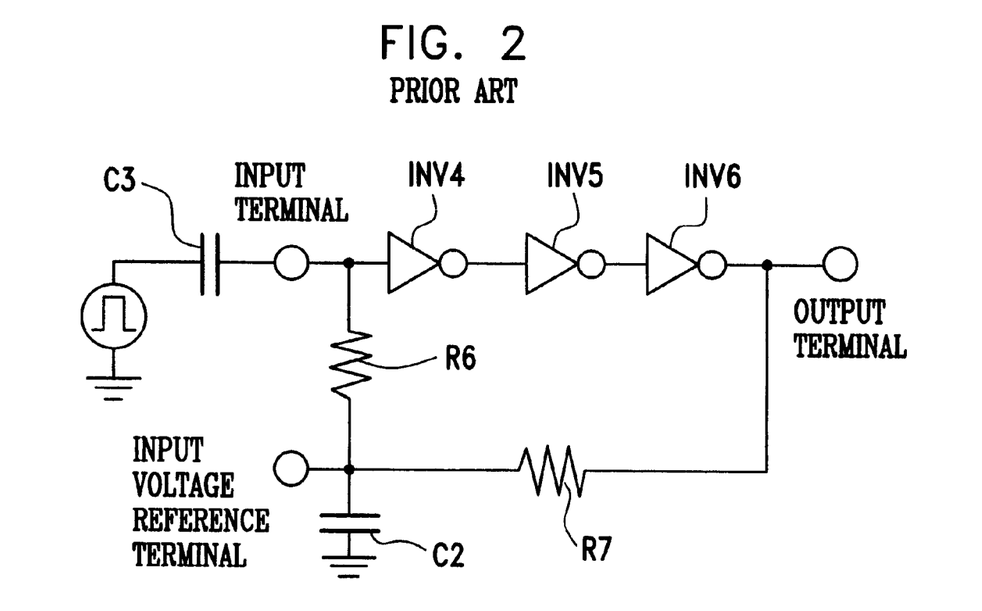
FIG. 2 is a connection diagram showing a conventional example of the cascade connection type inverter circuit.

FIG. 2 is a view showing a conventional example of the inverter circuit used in the above input circuit of the limiting amplifier. Note that the above document explains a case in which a GaAs MESFET (a metal semiconductor FET) is used as a semiconductor element constituting the inverter circuit and a DCFL (direct coupled FET logic) is used as a basic logic circuit.

In FIG. 2, an input signal is input from a third input terminal. The third input terminal is connected to a mid-point of the connection between an input terminal of a fourth inverter INV4, which constitutes a first stage, and one of the electrodes of a sixth resistor R6, which constitutes an end terminal. The other electrode of the sixth resistor R6 is connected to a mid-point of the connection between one of the electrodes of the second capacitor C2 and one of the electrodes of a seventh resistor R7. The other electrode of the seventh resistor R7 is connected to an output terminal of the sixth inverter INV6, which constitutes the last stage. The output terminal of the fourth inverter INV4 is connected to the input terminal of the fifth inverter INV5. The output terminal of the fifth inverter INV5 is connected to the input terminal of the sixth inverter INV6.

Figure 3:
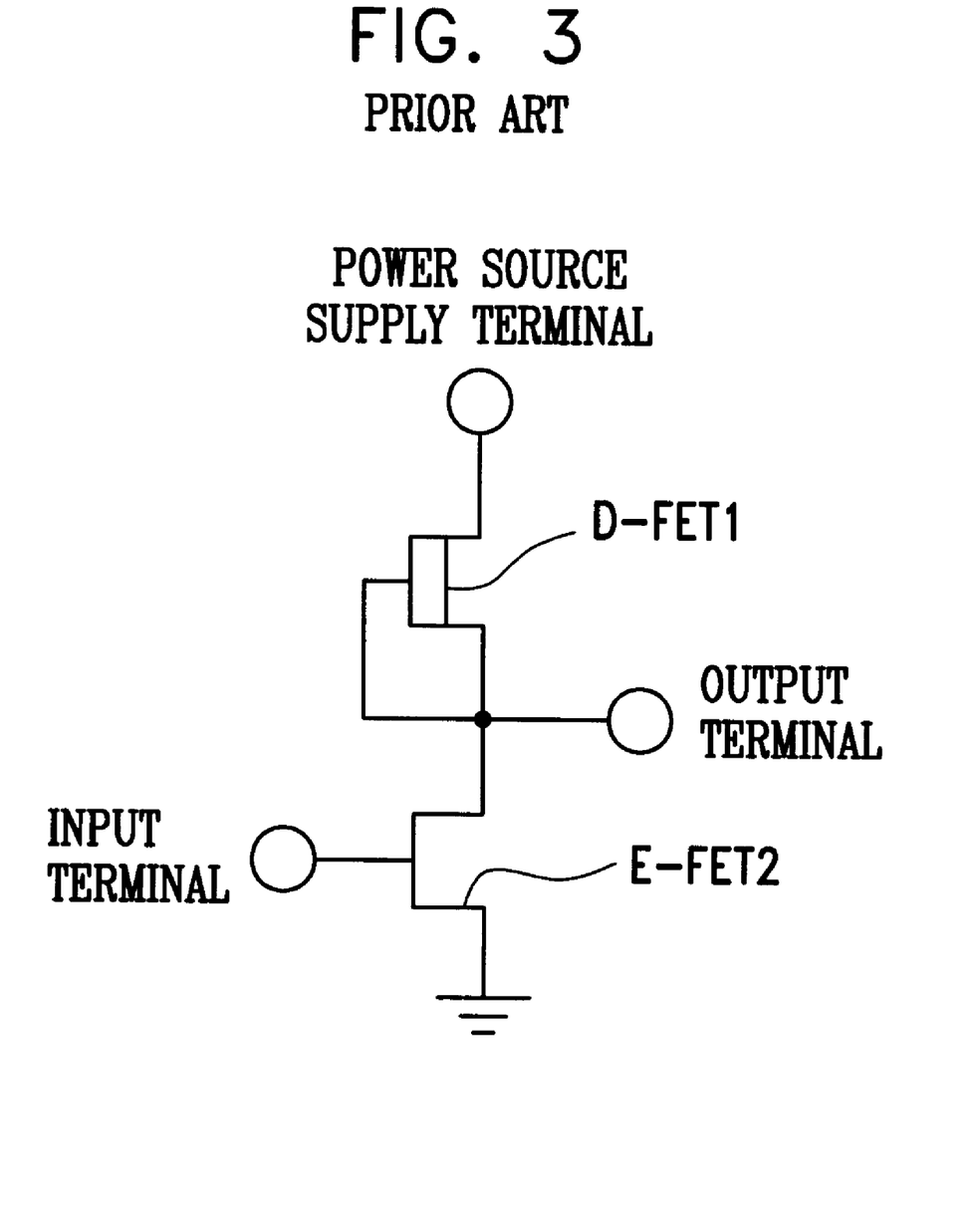
FIG. 3 is a connection diagram showing a circuit structure of the inverter.

FIG. 3 shows a circuit structure of the fourth inverter INV4, the fifth inverter INV5 and the sixth inverter INV6. Each of these inverters uses a depletion-type FET (referred to as D-FET hereinafter) in the load thereof while an enhancement type FET (hereinafter referred to as E-FET) is used in the switching portion thereof. Note that a drain electrode of the first D-FET1, which constitutes the load, is connected to the second power source supply terminal. Furthermore, the gate electrode of the first D-FET1 and the source electrode thereof are short-circuited. At the same time, the gate electrode and the source electrode are connected to the drain electrode of the second E-FET2, which functions as the switching portion, and to the second output terminal, which constitutes the output of the inverter. For reference, the gate electrode of the second E-FET2 is connected to the second input terminal, which constitutes the input of the inverter. Furthermore, the source electrode of the second E-FET2 is grounded.

In the inverter circuit shown in FIG. 2, the input signal, which is input via the third condenser C3, is propagated via the fourth, fifth, and sixth inverters INV4 to INV6 so as to approach the logic level of the basic logic circuit, and is then output.

Note that, in an inverter circuit having this type of configuration, a high loop gain can be obtained with the serial connection of the fourth inverter, the fifth inverter and the sixth inverter INV4 to INV6. Consequently, when the output signal is fed back to the input side via the seventh resistor R7, the logic threshold value of the fourth inverter INV4 and the central voltage of the amplitude of the input signal can be matched with each other. When the central voltage of the amplitude of the input signal and the logic threshold value of the inverter match each other, it becomes possible to maintain on an equal level the duty ratio, which is a time ratio between the high level of the input signal and the low level thereof.

However, in a conventional input circuit, when the amplitude of the input signal increases at the time when the input signal is a high level signal, a Schottky current flows out between the gate and the source of the switching FET (E-FET2) of the fourth inverter INV4, which has the effect of lowering the voltage which appears in the third input reference voltage. This leads to the generation of a disparity between the central voltage of the amplitude of the input signal and the logic threshold value of the fourth inverter INV4.

After this type of high level signal, which causes a Schottky current to flow out in this way has been input, the central voltage of the amplitude of the input signal is lowered with the result that the low level of the input signal becomes lower than the original low level (a voltage which is lower by ½ of the amplitude of the input signal from the logic amplitude of the fourth inverter INV4).

The lowering of this voltage leads to a change in the duty ratio in the signal that is applied to each of the inputs of the fifth inverter INV5 and the sixth inverter INV6. As a consequence, there arises a problem in that the duty ratio output from the sixth inverter INV6 will be greatly changed as compared with the duty ratio of the input signal.

Furthermore, in a conventional circuit, when the duty ratio of the signal output from the sixth inverter is controlled, it is necessary to directly control the third input reference voltage. However, there is a problem that this type of highly sensitive and stable control are difficult when this type of control is performed.

The present invention has been made in consideration of the issue (problem) described above. An object of the present invention is to provide a cascade connection type inverter circuit that is capable of obtaining an output signal exhibiting little change in the duty ratio with respect to the input signal as compared with the conventional art, and which can be controlled in a highly sensitive and stable manner even when the duty ratio is controlled. A further object of the present invention is to provide a limiting amplifier having excellent input and output characteristics by using this type of cascade connection type inverter circuit.

SUMMARY OF THE INVENTION

In order to solve the problems described above, according to a first aspect of the present invention, there is provided a cascade connection type inverter circuit in which the inverters at odd-numbered stages are connected in a cascade manner, and an output of the inverter at the last stage is fed back to the input circuit of the inverter at the first stage via an impedance element, the circuit being characterized in that the connection described below is adopted.

Namely, a switching means is connected between the output terminal and the input terminal of the inverter at the first stage, the switching means supplying to an input circuit of the inverter at the first stage a compensation current for compensating a disparity between the logic threshold value of the inverter at the first step and the central voltage of the input signal thereof when the voltage generated between the output terminal and the input terminal of the inverter at the first stage exceeds a predetermined threshold value. Here, it is desirable to use transistors and diodes as the switching means.

With the adoption of this type of configuration, when the voltage generated between the output terminal and the input terminal exceeds a predetermined threshold value, for example, when the level of the signal applied to the input terminal is "L", and the level of the signal appears at the output terminal is set to "H", the central voltage of the input signal, which was lowered under the influence of the current following when the level of the signal applied to the input terminal is set to "H" and the level of the signal that appears at the output terminal is set to "L," can be raised back to the original voltage by the compensation current provided by the switching means.

As a consequence, changes in the duty ratio that appear in a signal waveform that is propagated at each inverter stage can be minimized, and the change in the duty ratio can be restricted to a low level for the output signal waveform output from the last stage.

Furthermore, according to a second aspect of the present invention, there is provided a cascade connection type inverter circuit according to the first aspect and the second aspect of the present invention, in which an impedance element for feeding an output of the inverter at the last stage back to the input circuit of the inverter at the first stage is changed to a series connection circuit comprising a plurality of impedance elements, and a control voltage for controlling the duty ratio of the signal waveform that appears at the output of the inverter at the last stage, is supplied via the impedance element to at least one of the mid-points of the connection between each of the impedance elements.

As mentioned before, the second preferred embodiment of the invention can adjust the duty ratio finely with the application of the control voltage (variable control, switching control and the like) without greatly changing the feedback conditions of the output of the inverter at the last stage to the input circuit of the inverter at the first stage. Accordingly, the second preferred embodiment of the invention can control the duty ratio of the signal waveform that appears at the output of the inverter at the last stage in a highly sensitive and stable manner as compared with a conventional device.

Furthermore, according to a third aspect of the present invention, there is provided a cascade connection type inverter circuit in which the inverters at odd-numbered stages are connected in a serial manner, and an output of the inverter at the last stage is fed back to the input circuit of the inverter at the first stage via an impedance element, the circuit being characterized in that an impedance element is connected between an output terminal and an input terminal of the inverter at the first stage.

Even in this type of configuration, the compensation current corresponding to the voltage that is generated between the output terminal and the input terminal can be supplied to the input circuit of the inverter at the first stage, and the compensation can be made even when the waveform of the input signal is small.

Furthermore, according to a fourth aspect of the present invention, there is provided a limiting amplifier comprising an input stage comprising an inverter circuit and an output stage comprising an output buffer having a clamp function, the amplifier being characterized in that the cascade connection type inverter circuit according to any of the first to third aspects of the present invention is used as the inverter circuit comprising the input stage.

This configuration enables the duty ratio of the signal wave form input to the output buffer having the clamp function that is an output stage, to come close to the duty ratio of the input signal to the input stage with the result that favorable input and output characteristics can be realized as compared with the conventional example.

DESCRIPTION OF THE PREFERRED EMBODIMENTS

First Embodiment (A-1) Circuit Structure

Figure 1:
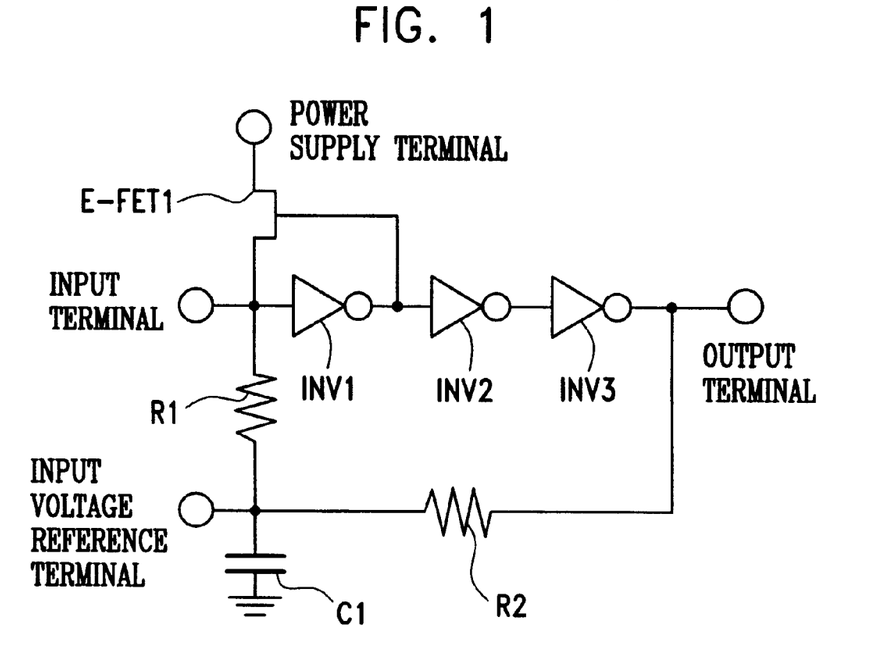
FIG. 1 is a connection diagram showing a cascade connection type inverter circuit according to a first embodiment of the present invention.

A cascade connection type inverter circuit according to a first embodiment of the present invention will be explained hereinbelow. FIG. 1 is a diagram showing the connection structure of the cascade connection type inverter circuit according to the first embodiment of the present invention. Note that, in the first embodiment, a GaAs MESFET is used as a semiconductor device, and a DCFL is used in the basic logic circuit. An FET comprising another semiconductor material may of course be used. A logic circuit having another structure may be used. Furthermore, the inverter circuit may be formed from a consolidation of a plurality of kinds of transistors having different structures.

Firstly, an outline of the difference between the cascade connection type inverter circuit according to the present invention and a conventional circuit will be explained. The difference between the two circuits is that a first E-FET1 for compensating for the change in the logic threshold value of the first-stage inverter, which is lowered due to the outflow of the Schottky current, is connected between the output terminal and the input terminal of the inverter at the first stage out of the odd number of inverters. A specific connection structure will be explained hereinbelow.

In FIG. 1, the input signal is input from the first input terminal. The first input terminal is connected to the mid-point of the connection between the input terminal of the first inverter INV1 constituting the first stage and one of the electrodes of the first resistor R1 constituting a terminating resistor. Furthermore, the source electrode of the first E-FET1, which is a component part peculiar to the first embodiment, is connected to the mid-point of the connection thereof.

The output terminal of the first inverter INV1 is connected to the input terminal of the second inverter INV2 and the gate electrode of the first E-FET1. Note that, the drain electrode of the first E-FET1 is connected to the first power source supply terminal. The output terminal of the second inverter INV2 is connected to the input terminal of the third inverter INV3. The output terminal of the third inverter INV3 is connected to the first output terminal and the other electrode of the second resistor R2.

The other electrode of the second resistor R2 is connected to the other electrode of the first resistor R1 and to one of the electrodes of the first capacitor C1. Note that the other electrode of the second resistor R2 is also connected to the first voltage reference terminal. Note that the other electrode of the first capacitor C1 is grounded.

However, the structures of the first, second and third inverters INV1 to INV3 are the same as the structure used in the explanation on the prior art. In other words, the structure shown in FIG. 3 is used here. The output terminal of the second inverter INV2 may also be connected to the input terminal of the third inverter INV3 and the other electrode of the second resistor R2. In this case, the output terminal of the third inverter INV3 is only connected to the first output terminal in the above embodiment.

(A-2) Circuit Operation

Next, the operation of the cascade connection type inverter circuit according to the embodiment having the structure described above will be explained. Note that, since the transmission of the input signal is basically the same as in a conventional circuit, the explanation thereof is omitted here, and emphasis will be given to an explanation on the way the Schottky current that flows between the gate and the source for the switching FET (E-FET2) of the first inverter INV1 is compensated.

Furthermore, FIGS. 4 to 7 show a conceptual example of the way the duty ratio of the input and output waveform is compensated in the cascade connection type inverter circuit according to the first embodiment and in the conventional circuit. In FIGS. 4 to 7, a solid line denotes a waveform in the first embodiment while a dotted line denotes a waveform of a conventional circuit.

Figure 4:
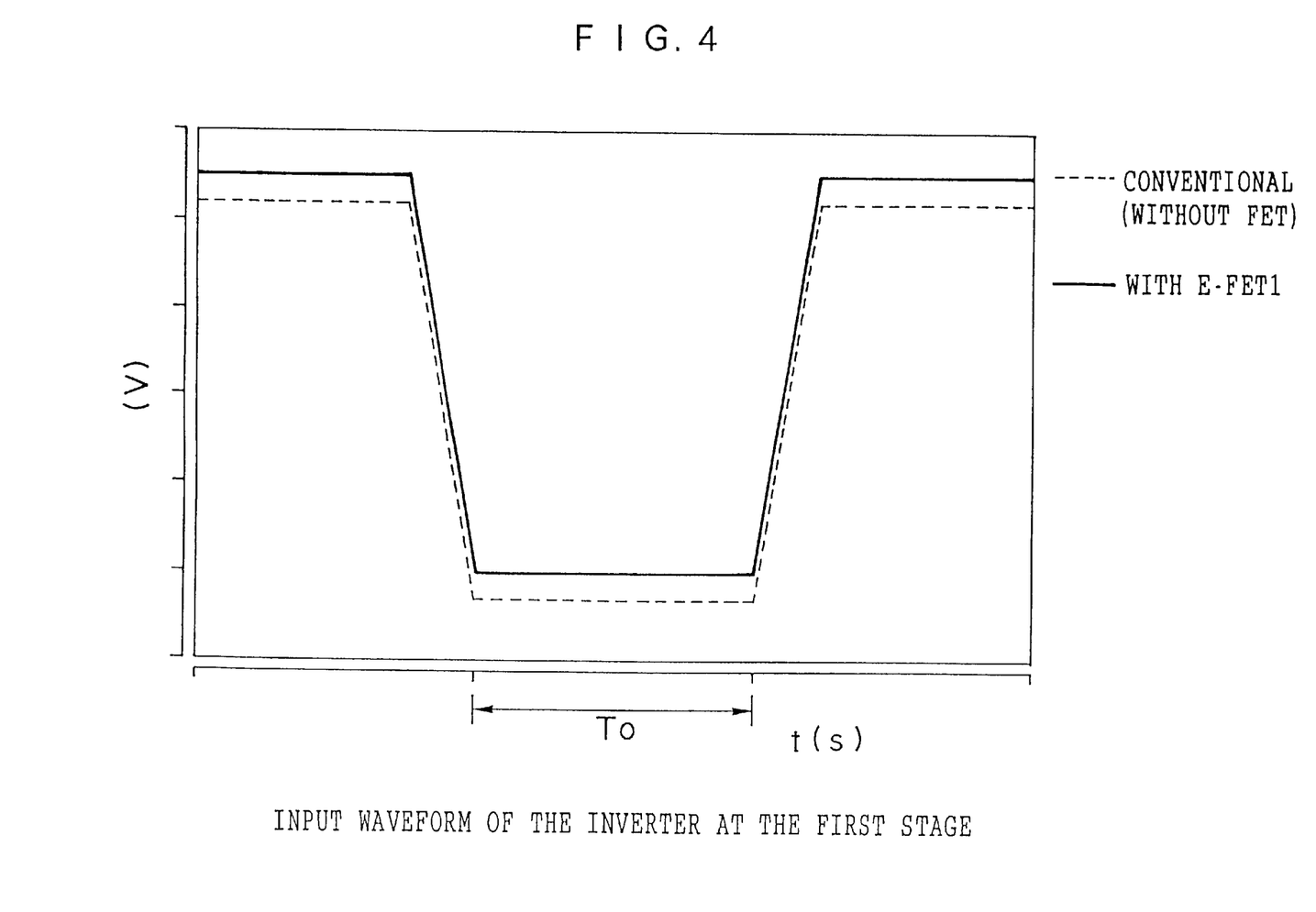
FIG. 4 is a view showing an input signal waveform applied to the inverter at the first stage.
Figure 5:
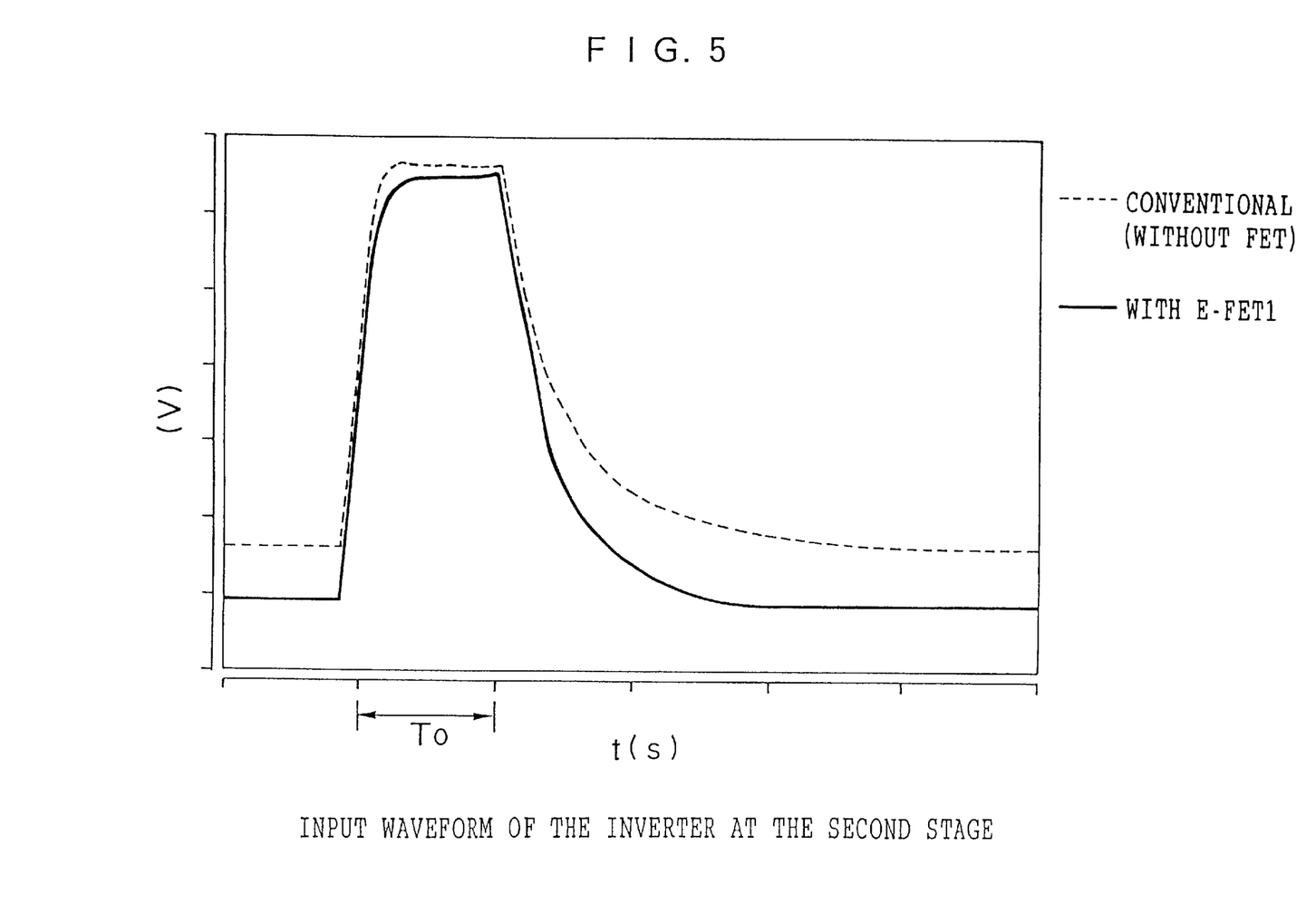
FIG. 5 is a view showing an input signal waveform applied to the inverter at the second stage.
Figure 6:
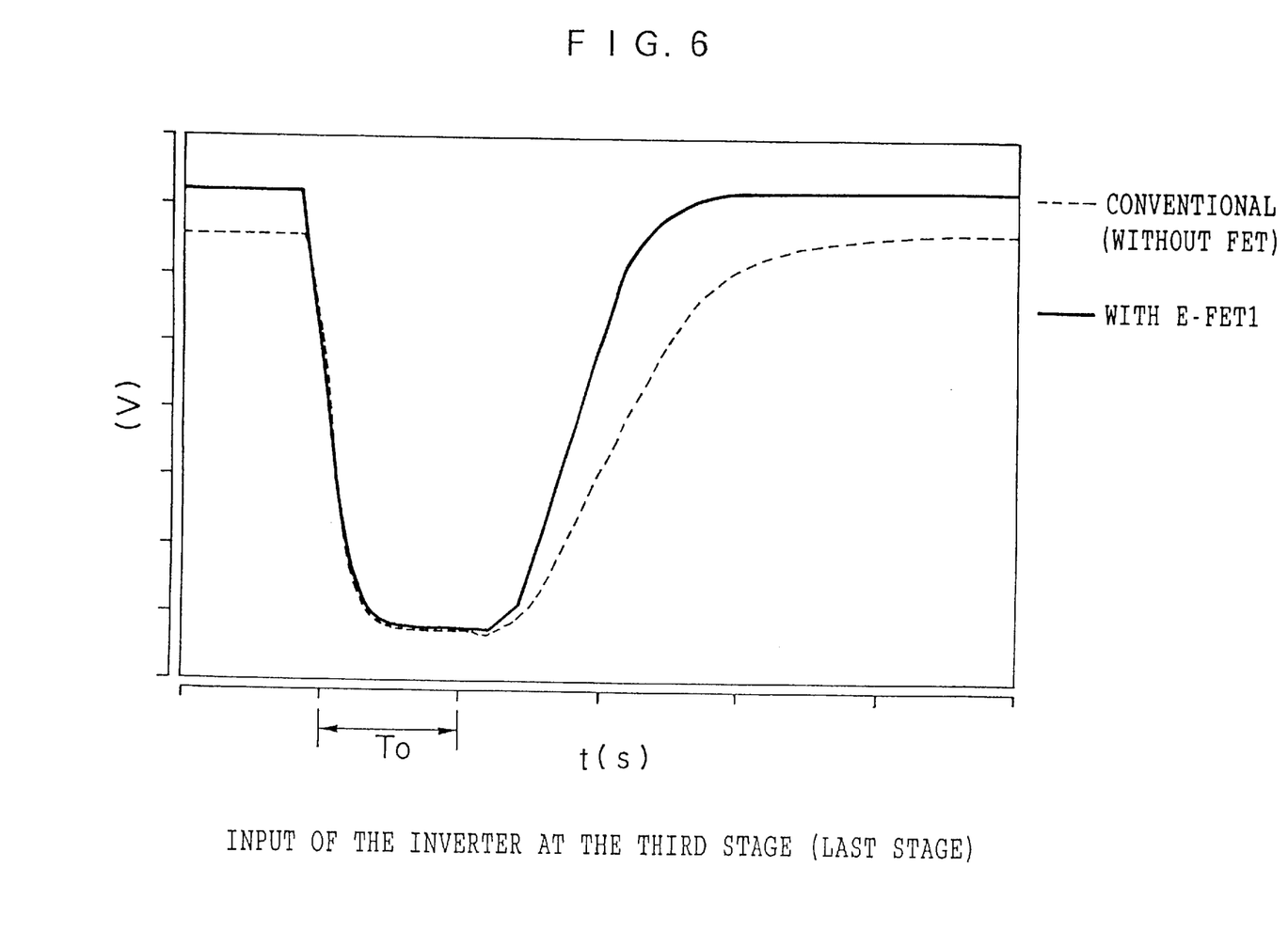
FIG. 6 is a view showing an input signal waveform applied to the inverter at the third stage.
Figure 7:
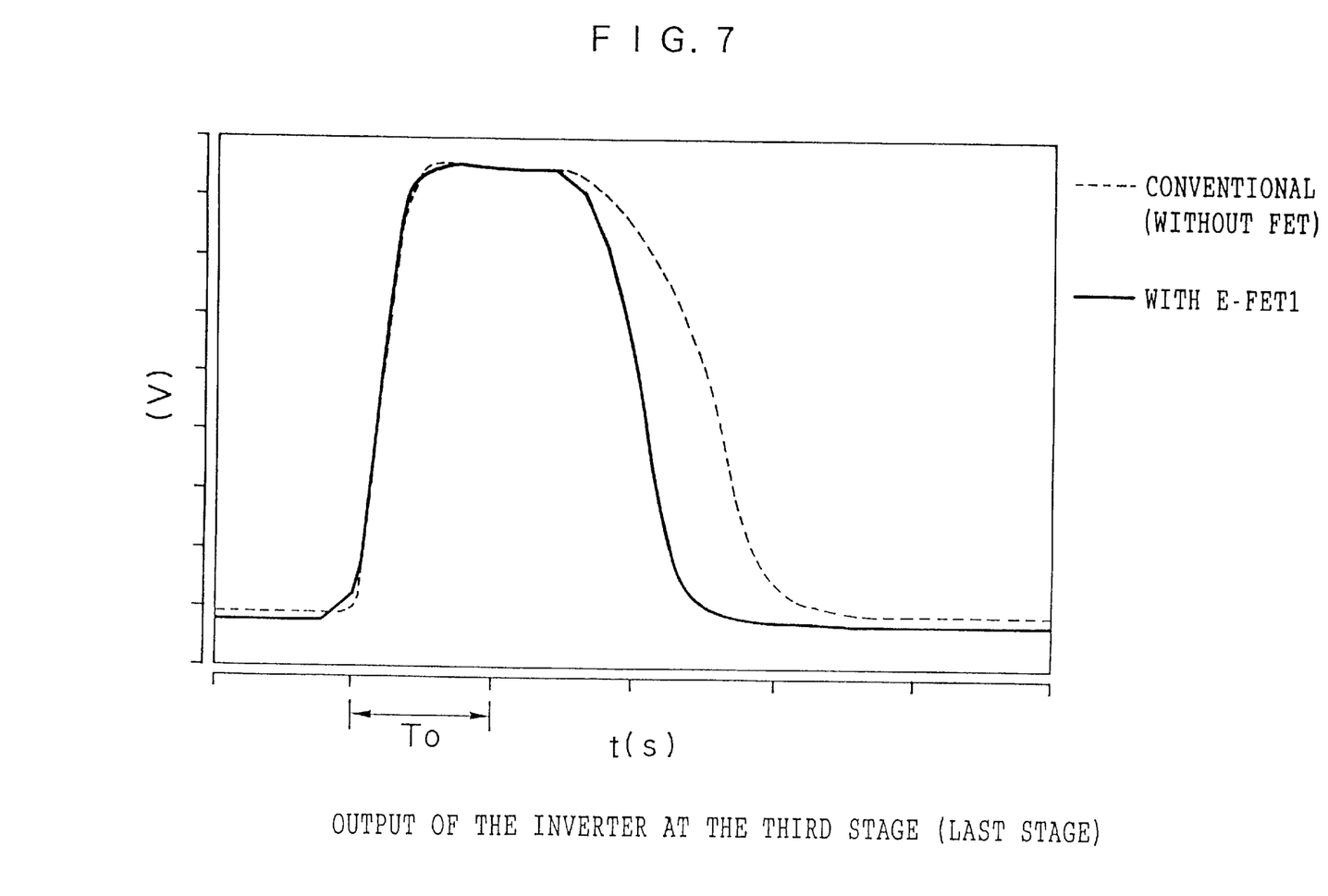
FIG. 7 is a view showing an output signal waveform output from the inverter at the third stage.

Note that FIG. 4 is a view showing an input signal waveform input to the inverter at the first stage. FIG. 5 is a view showing an input signal waveform input to the inverter at the second stage (namely, an output signal waveform output from the inverter at the first stage). FIG. 6 is a view showing an input signal waveform input to the inverter at the third stage (namely, an output signal waveform output from the inverter at the second stage) FIG. 7 is a view showing an output signal waveform output from the inverter at the third stage. Here, FIG. 4 is different from FIGS. 5 to 7 in the scale width of the horizontal axis. However, these differences are differences on the diagram and both FIG. 4 and FIGS. 5 to 7 represent the same time intervals.

As shown in FIG. 1, after the input signal input from the first input terminal is inverted and amplified by the first inverter INV1, the input signal is applied to the input terminal of the second inverter INV2 and the gate electrode of the first E-FET1.

Firstly, the case of a high level input signal will be considered. In this case, the value that is inverted and amplified by the first inverter INV1 is changed to a low level. Consequently, the value does not exceed the threshold value of the voltage between the gate and the source of the first E-FET1. The first E-FET1 is not turned on and operated. In other words, the drain current is not allowed to flow out.

In the above state, when the amplitude of the input signal is small and does not exceed the Schottky barrier voltage of the E-FET2 constituting the switching FET of the first inverter INV1, the Schottky current does not flow out to the E-FET2 and the central voltage of the input signal is not lowered. In contrast, when the amplitude of the input signal increases and exceeds the Schottky barrier voltage of the switching E-FET2, the Schottky current flows out to the E-FET2 and the central voltage of the amplitude of the input signal is lowered.

Next, a case in which the input signal is switched to a low level will be considered. In this case, the potential applied to the gate potential of the first inverter INV1 is raised with respect to the source potential by being inverted and amplified by the first inverter INV1. This potential difference increases as the amplitude of the input signal increases. Then, when the voltage between the gate and the source of the first E-FET1 exceeds a predetermined threshold level, the first E-FET1 is turned on and operated with the result that the drain current begins to flow.

This drain current flows through the input circuit in such a manner that the Schottky current that flows out from the gate electrode of the switching FET (E-FET2) of the first inverter INV1 is compensated, with the result that the drain current raises the central voltage of the input signal, and the circuit is operated in such a manner that the central voltage is again matched the logic threshold value of the first inverter INV1. This means that the rise time required for the signal waveform applied to the first inverter INV1 can be shortened. Consequently, the required delay in the rise time can be kept short as compared with the conventional circuit (FIG. 2).

(A-3) Advantages of the First Embodiment

As has been explained above, in the cascade connection type inverter circuit according to the first embodiment of the present invention, an output of the first inverter INV1 is fed back to the input of the first inverter INV1 via the first E-FET1, with the result that the current that flows out from the gate electrode of the switching. FET (E-FET2) of the first inverter INV1 cane compensated, and the central voltage of the input signal and the logic threshold value of the first inverter INV1 can be match with each other.

As a result, the signal voltage can be prevented from rising too much for the signal waveform (FIG. 5) that appears at the output of the first inverter INV1 (namely, the input of the second inverter INV2) . Furthermore, the amount of current flowing through the second E-FET2 can be increased enough for a sufficiently high voltage to be applied to the input of the first inverter INV1, and the signal waveform (FIG. 5) appearing at the output can be rapidly reduced by the same amount. Thus, the required delay in the rise time of the signal waveform (FIG. 6) applied to the input of the third inverter INV3 can be kept short.

The result is that the difference between the duty ratio of the signal waveform (FIG. 7) finally output from the output terminal (first output terminal) of the third inverter INV3 and the duty ratio of the signal waveform (FIG. 4) that is input to the first inverter INV1, can be decreased as compared with the conventional circuit.

Figure 8:
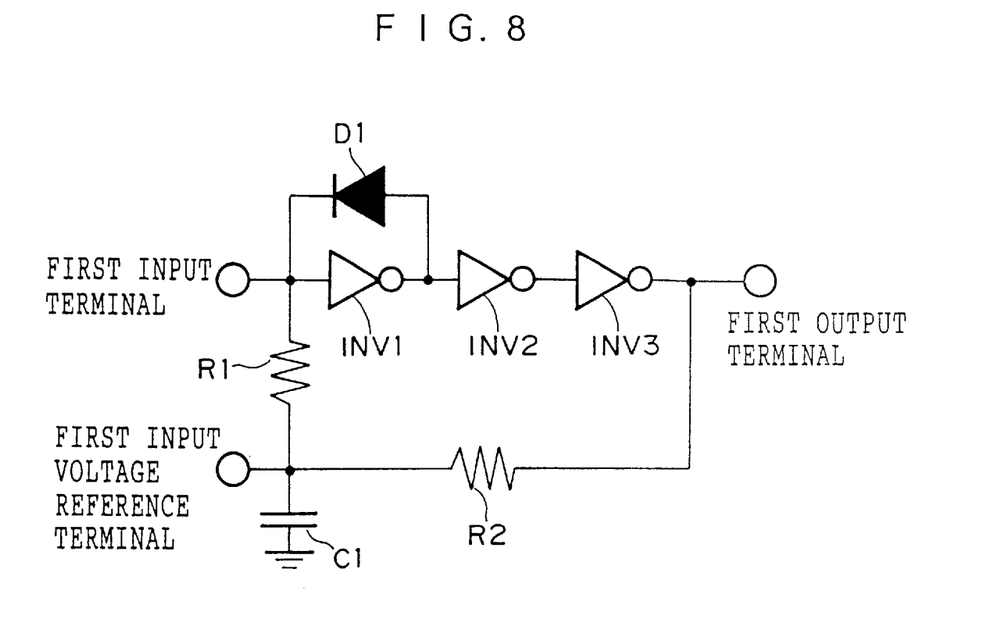
FIG. 8 is a connection diagram showing a circuit structure according to a variation example 1.

(A-4) Variation Example of the First Embodiment (1) In the first embodiment described above, there is described a case in which the first E-FET1 is used for feeding the output of the first inverter INV1 back to the input of the first inverter INV1. However, as shown in FIG. 8, the first Schottky diode D1 may be used in place of the first E-FET1. In this case, the current that flows through the first Schottky diode D1 compensates the current portion that flows out from the switching FET (E-FET2) of the first inverter INV1.

Note that, in the case of the embodiment described above, the compensation current for compensating the Schottky current is allowed to flow when the voltage between the gate and the source of the E-FET1 exceeds the threshold value. However, in the case of the variation example, the Schottky current compensation current is allowed to flow when the compensation current exceeds the Schottky barrier voltage of the Schottky diode D1. Consequently, in the variation example, the current can be compensated in the amplitude of a larger input signal as compared with the embodiment described above.

Figure 9:
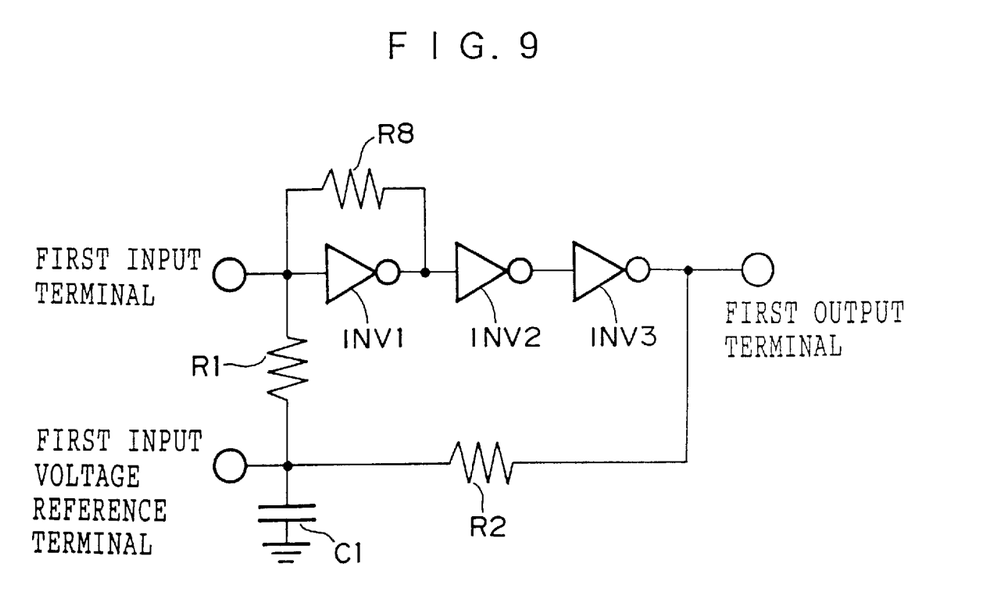
FIG. 9 is a connection diagram showing a circuit structure according to a variation example 2.

(2) Furthermore, the example in the above embodiment describes a case in which the first E-FET1 is used to feed the output of the first inverter INV1 back to the input of the first inverter INV1, however, as shown in FIG. 9, an eighth resistor R8 may be used in place of the first E-FET1. In this case, the current that flows through the eighth resistor R8 compensates the current portion that flows out from the switching FET (E-FET2) of the first inverter INV1. A passive element or an active element like an FET may also be used instead of the eighth resistor R8 in the above embodiment.

Note that, in the case where the first E-FET1 described above is used, the compensation current is allowed to flow only as long as the voltage between the gate and the source exceeds the predetermined threshold value. However, in the case where the eighth resistor R8 is used, as in this variation example, the compensation current is allowed to flow continually as long as the input signal is being input, with the result that the loss portion caused by the Schottky current which flows out using an input signal having a relatively small amplitude can be compensated.

Second Embodiment (B-1) Circuit Structure

Figure 10:
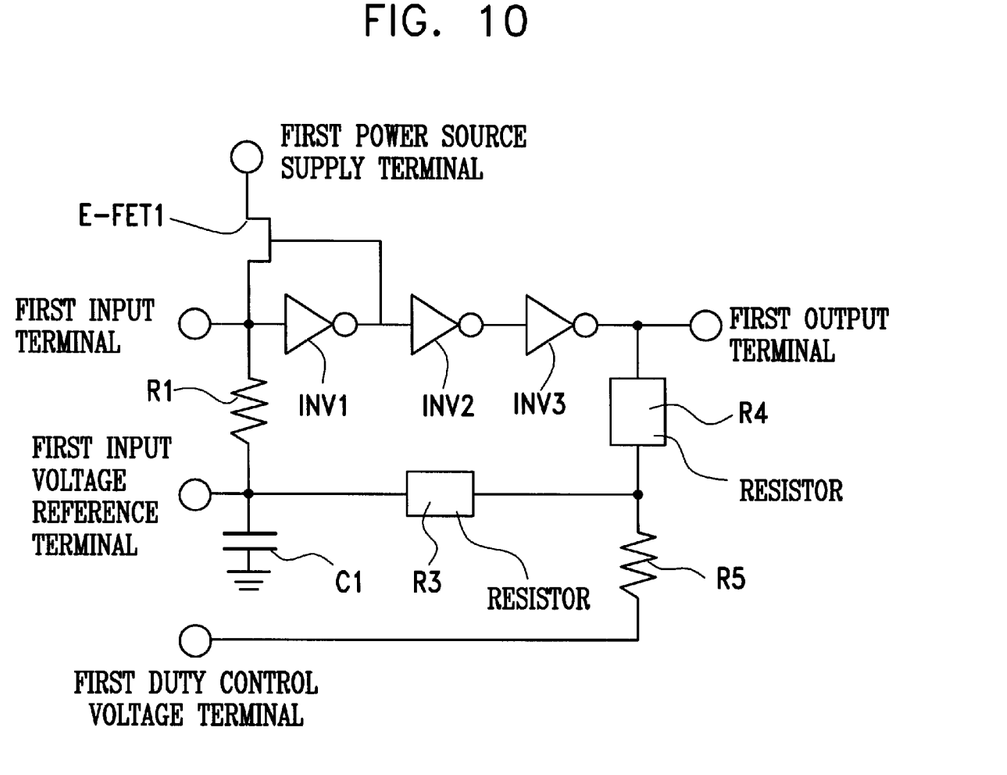
FIG. 10 is a connection diagram showing a cascade connection type inverter circuit according to a second embodiment of the present invention.

A cascade connection type inverter circuit according to a second embodiment of the present invention will now be explained. The cascade connection type inverter circuit according to the second embodiment is a circuit that is based on the circuit structure of the cascade connection type inverter circuit according to the first embodiment of the present invention. Furthermore, the inverter circuit is characterized in that a circuit portion is provided for controlling in a stable manner the duty ratio that appears in the first output terminal.

FIG. 10 is a diagram showing a structure of the cascade connection type inverter circuit according to the second embodiment. Note that, in FIG. 10, the same portions as in FIG. 1 are denoted by the same reference numerals.

The circuit structure shown in FIG. 10 is changed from the circuit structure shown in FIG. 1 in that the output of the third inverter INV3 is fed back to the input side via a series circuit comprising a fourth resistor R4 and a third resistor R3, a fifth resistor R5 is connected to a mid-point of the connection between the fourth resistor R4 and the third resistor R3, and the first duty control voltage is applied to the mid-point of the connection via the fifth resistor R5.

Here, the first duty control voltage is used for the adjustment of the potential at the mid-point of the connection between the third resistor R3 and the fourth resistor R4. By adjusting the amount of the current that flows into the third resistor R3 and the amount of the current that flows into the fourth resistor R4, the duty ratio of the output signal waveform can be adjusted.

Note that the sum of the resistance value of the third resistor R3 and the resistance value of the fourth resistor R4 is set to the same level or to approximately the same level as the resistance value of the second resistor R2 used in the first embodiment. Accordingly, the second embodiment can be set to be substantially the same as, and have substantially the same basic feedback conditions as the first embodiment, with the result that the same advantages as in the first embodiment can be expected from the second embodiment.

Note that, in the case where the resistor described above is used as an impedance element, the third resistor R3 corresponds to a first impedance element while the fourth resistor R4 corresponds to a second impedance element. Furthermore, it is taken that the fifth resistor R5 corresponds to the third impedance element. The first and the second impedance elements comprise at least one impedance element.

(B-2) Circuit Operation

Subsequently, the operation of the cascade connection type inverter circuit according to the embodiment having the structure described above will be explained. Note that the basic operation of this cascade connection type inverter circuit is the same as the first embodiment. In other words, the second embodiment has the same basic advantage as the first embodiment in that the duty ratio of the output signal waveform that appears at the first output terminal is improved as compared with the conventional circuit.

Therefore, in the following explanation, the explanation is centered on the adjustment operation of the duty ratio by the variable control of the first duty control voltage.

For example, when the potential of the control voltage fed back to the terminal of the first duty control voltage is raised, the potential difference generated between both terminals of the third resistor R3 can be enlarged and the amount of the current allowed to return to the input circuit of the first inverter INV1 via the third resistor R3 can be increased. As a consequence, the potential that appears at the first voltage reference terminal can be increased, and in turn, a fine adjustment can be made to the central potential of the input signal waveform that is input to the input terminal of the first inverter INV1, so that the central potential of the input signal waveforms is increased. Note that, in contrast to this, when the potential of the control voltage applied to the first duty control voltage terminal is lowered, a fine adjustment can be made to the central potential of the input signal waveform that is input to the input terminal of the first inverter INV1, so that the central potential of the input signal waveform is lowered. By this type of adjustment, the duty ratio of the output signal waveform can be adjusted.

Note that the adjustment width and the sensitivity here can be set by selecting the ratio of the resistance value of the third resistor R3 to the resistance value of the fourth resistor R4. For example, when the resistance value of the third resistor R3 is set to a value smaller than the resistance value of the fourth resistor R4, the current that flows through the third resistor R3 can be easily changed with respect to the change in the first duty control voltage. Consequently, in this type of case, the duty control operation having a favorable sensitivity with respect to the duty control voltage that is applied can be made possible.

On the other hand, when the resistance value R3 of the third resistor R3 is made larger than the resistance value R4 of the fourth resistor R4, the current which flows through the third resistor R3 is difficult to change with respect to the change in the first duty control voltage. Consequently, in this type of case, the duty control operation having a low level of sensitivity with respect to the duty control voltage to be applied can be made possible.

Furthermore, in the present embodiment, the duty control voltage is not directly applied to the position of the mid-point of the connection between the third resistor R3 and the fourth resistor R4, but the duty control voltage is applied via the fifth resistor R5. The purpose of such a procedure is to prevent the duty control voltage applied to the first duty control voltage directly acting on the output signal that appears at the first output terminal, so that no disorder is generated in the signal waveform.

Note that because of this, in this embodiment, the resistance value of the fifth resistor R5 is set to a level sufficiently large as compared with the third resistor R3 and the fourth resistor R4, with the result that virtually no current is allowed to flow through the fifth resistor R5. As a consequence, even when the duty control voltage is changed, the current amount (feedback current) that flows through the fourth resistor R4 does not greatly change, so that stable duty control can be performed.

(B-3) Advantage of Second Embodiment

As has been described above, in the cascade connection type inverter circuit according to the second embodiment, a fine adjustment can be made to the duty ratio of the output signal waveform that appears at the first output terminal by controlling the control voltage applied to the first duty control voltage terminal, with the result that the waveform can be further adjusted as compared with the first embodiment.

Furthermore, in the case of the second embodiment, an adjustment of the sensitivity towards the duty control voltage to be applied can be freely set by changing the ratio of the resistance value of the third resistor R3 to the resistance value of the fourth resistor R4.

Furthermore, a stable and highly precise control of the duty of the output signal that is output from the first output terminal can be achieved by providing the fifth resistor R5.

(B-4) Variation Example of the Second Embodiment (1) Moreover, in the case of the second embodiment, as in the case of the first embodiment, the first Schottky diode D1 can be used in place of the first E-FET1 (refer to FIG. 8). Furthermore, the eighth resistor R8 can be used in place of the first E-FET1 (refer to FIG. 9).

(2) Furthermore, in the explanation on the embodiment described above, it is presupposed that both the third resistor R3 and the fourth resistor R4 have fixed resistance values. However, when variable resistors are used as the third resistor R3 and the fourth resistor R4, the sensitivity with respect to the duty control voltage can be adjusted later, after the cascade connection type inverter circuit is manufactured. With such a procedure, more precise and optimal duty control can be made possible.

(3) Furthermore, in the embodiments described above, an explanation is provided for a case in which the feedback circuit for feeding the output from the cascade connection type inverter circuit back to the input circuit of the inverter at the first stage, is constituted from a series circuit of the third and fourth resistor, R3 and R4, and the duty control voltage is applied to the mid-point of the connection between the two resistors via the fifth resistor R5. The feedback circuit may be constituted from a series connection circuit having three or more resistors. In that case, control voltages that are different from each other may be selectively applied to the mid-point of the connection between respective resistor elements or to a portion thereof, with the result that the duty ratio can be controlled. It goes without saying that individual control voltage can be made variable in the same manner as the embodiments described above.

(C) Other Embodiments (1) In the embodiments described above, there is described a case in which as a transistor constituting the circuit, a MESFET is used which allows the current to flow from the gate electrode. However, a bipolar transistor in which the current flows from the base electrode may instead be used.

Note that, in this case, as the transistor corresponding to the first E-FET1 for compensating the Schottky current that flows through the switching FET (E-FET2) of the first inverter INV1, an NPN bipolar transistor may be used.

(2) Furthermore, in the embodiments described above, a case is described in which the first E-FET1 and the first Schottky diode D1 are used to compensate the loss portion caused by the Schottky current. Other means having the same function may be connected, for example, a switching circuit that supplies a compensation current for compensating the input circuit of the inverter at the first stage for changes in the central voltage of the amplitude of the input signal when the voltage generated between the output terminal and the input terminal of the inverter at the first stage exceeds a predetermined threshold value.

In this case, the embodiments are not limited to a case in which the switching circuit is constituted of a single element, and the switching circuit may have a circuit structure comprising a combination of one or more active elements and passive elements. Note that the switching circuit here is not simply limited to a function of switching the circuit between supplying the current compensating the Schottky current and not supplying the current, but may be constituted in such a manner that the compensation current supplied in accordance with the size of the voltage applied from the output terminal of the first inverter INV1 to the input terminal is increased or decreased in the same manner as when transistors and diodes are used therein.

(3) In the embodiments described above, a case is described in which the number of stages of the inverters constituting the cascade connection type inverter circuit is set to three, however, the number of steps of the inverters is not limited thereto, and 5-stage and 7-stage or more inverters may also be used in the present embodiment.

(4) In the embodiments described above, a case is described in which the form of connection shown in FIG. 3 is used in each of the inverter stages. Moreover, a case is described in which an E-type FET is used as a transistor for compensating the Schottky current. The type of each of the transistors constituting these components can be conveniently changed to a different type in accordance with the circuit structure. Note that, the same thing applies to when the FET is replaced with a bipolar transistor or a transistor having an opposite polarity. Furthermore, depending on the circuit structure, the direction of the connection of the diode may also be set to the opposite direction.

(5) In the embodiments described above, a case is described in which resistor elements are used both as an element (FIG. 9) used for compensating a decrease in the central voltage of the input signal with the compensation current, and further as an element (FIG. 1, FIG. 8, FIG. 9, and FIG. 10) constituting the feedback circuit for feeding the output of the cascade connection type circuit back to the first stage. These resistor elements may be replaced with other impedance elements that perform the same function as these resistor elements.

(6) In the embodiments described above, a case is described in which the compensation current is supplied to the input circuit of the inverter at the first stage in order to compensate any disparity between the logic threshold value of the inverter at the first stage and the central voltage of the input signal, however, in contrast to this embodiment, the supply of the compensation current may also include a case where, due to the circuit structure, the current flowing into the input circuit of the inverter at the first stage in order to compensate for the disparity is controlled so as to be decreased.

(7) In the embodiments described above, the cascade connection type inverter circuit itself is described. However, this type of cascade connection type inverter circuit can be applied to various types of electronic circuit that are provided with the relevant circuit structure in a portion of their own circuit structure.

For example, the cascade connection type inverter circuit can be applied to a limiting amplifier that is provided with the cascade connection type inverter circuit at the input stage, and that is provided with a buffer attached with a clamp function at the output stage. Naturally, the first and the second embodiments and variation examples thereof can be applied to the cascade connection type inverter circuit.

What is claimed is:

1. An electrical circuit for receiving an input signal having a voltage, and producing an output signal, the circuit comprising:
   (a) a plurality of inverters, each inverter including an enhancement-type FET and a depletion-type FET, the drain of the depletion-type FET being connected to a power source, the gate and source of the depletion-type FET being directly connected to each other and to the drain of the enhancement-type FET, the source of the enhancement-type FET being connected to ground, each inverter having an inverter input at the gate of the enhancement-type FET, an inverter output at the drain of the enhancement-type FET, and a logic threshold value, each inverter inverting and amplifying the voltage at its input to provide an inverted and amplified voltage at its output, the inverters being serially connected together in a cascade;
   (b) a feedback impedance, connecting the output of the last inverter in the cascade to the input of the first inverter in the cascade; and
   (c) switching means connected between the input and output of the first inverter in the cascade for supplying a compensation current to the input of the first inverter when a voltage difference between the input and output of the first inverter exceeds a predetermined value, the compensation current compensating a disparity between the logic threshold value of the first inverter and the voltage of the input signal due to an outflow of current.

2. An electrical circuit according to claim 1, wherein the number of inverters are an odd numbers of inverters.

3. An electrical circuit according to claim 1, wherein the switching means includes at least one active element.

4. An electrical circuit according to claim 3, wherein the switching means includes a transistor having a control electrode and an output electrode, the control electrode being connected to the output of the first inverter in the cascade, and the output electrode being connected to the input of the first inverter in the cascade for supplying the compensation current to the input of the first inverter.

5. An electrical circuit according to claim 4, wherein the switching means includes an enhancement-type FET.

6. An electrical circuit according to claim 4, wherein the switching means includes a bipolar transistor.

7. An electrical circuit according to claim 1, wherein the feed back impedance includes first and second impedance elements each having a common connection in the circuit, the output signal appearing at the output of the last inverter in the cascade, further comprising a third impedance connected to the common connection and supplying a control voltage for controlling a duty ratio of the output signal to the common connection.

8. An electrical circuit according to claim 7, wherein at least one of the first, second and third impedance elements includes a resistor.

9. An electrical circuit for receiving an input signal having a voltage, and producing an output signal, the circuit comprising:
   (a) a plurality of inverters, each inverter including an enhancement-type FET and a depletion-type FET, the drain of the depletion-type FET being connected to a power source, the gate and source of the depletion-type FET being directly connected to each other and to the drain of the enhancement-type FET, the source of the enhancement-type FET being connected to ground, each inverter having an inverter input at the gate of the enhancement-type FET, an inverter output at the drain of the enhancement-type FET, and a logic threshold value, each inverter inverting and amplifying the voltage at its input to provide an inverted and amplified voltage at its output, the inverters being serially connected together in a cascade;
   (b) a feed back impedance, connecting the output of the last inverter in the cascade to the input of the first inverter in the cascade; and
   (c) a compensation impedance connected between the input and output of the first inverter in the cascade for supplying a compensation current to the input of the first inverter in accordance with a voltage applied to the compensation impedance, thereby compensating for a disparity between the logic threshold value of the first inverter and the voltage of the input signal due to an outflow of current.

10. An electrical circuit according to claim 9, wherein the compensation impedance includes at least one active element.

11. An electrical circuit according to claim 10, where compensation impedance includes an FET.

12. A limiting amplifier for receiving an input signal having a voltage and producing an output, comprising:
   (a) an input stage including:
      (i) a plurality of inverters, each inverter including an enhancement-type FET and a depletion-type FET, the drain of the depletion-type FET being connected to a power source, the gate and source of the depletion-type FET being directly connected to each other and to the drain of the enhancement-type FET, the source of the enhancement-type FET being connected to ground, inverter input at the gate of the enhancement-type FET, an inverter output at the drain of the enhancement-type FET, and a logic threshold value, each inverter inverting and amplifying the voltage at its input to provide an inverted and amplified voltage at its output, the inverters being serially connected together in a cascade;
      (ii) a feed back impedance, connecting the output of the last inverter in the cascade to the input of the first inverter in the cascade; and (iii) switching means connected between the input and output of the first inverter in the cascade for supplying a compensation current to the input of the first inverter when a voltage difference between the input and output of the first inverter exceeds a predetermined value, the compensation current compensating a disparity between the logic threshold value of the first inverter and the voltage of the input signal due to an outflow of current; and (b) an output buffer connected to the input stage, the output buffer including a means for clamping a signal.

13. An electrical circuit for receiving an input signal having a voltage, and producing an output signal, the circuit comprising:

(a) a plurality of inverters, each inverter including an enhancement-type FET and a depletion-type FET, the drain of the depletion-type FET being connected to a power source, the gate and source of the depletion-type FET being directly connected to each other and to the drain of the enhancement-type FET, the source of the enhancement-type FET being connected to ground, inverter input at the gate of the enhancement-type FET, an inverter output at the drain of the enhancement-type FET, and a logic threshold value, the inverters being serially connected together in a cascade;

(b) a feedback impedance, connecting the output of the last inverter in the cascade to the input of the first inverter in the cascade; and (c) switching means, including at least one active element, and connected between the input and output of the first inverter in the cascade for supplying a compensation current to the input of the first inverter when a voltage difference between the input and output of the first inverter exceeds a predetermined value, the compensation current compensating a disparity between the logic threshold value of the first inverter and the voltage of the input signal, wherein the switching means includes a diode having two terminals, wherein one terminal is connected to the output of the first inverter, and the other terminal is connected to the input of the first inverter.

14. An electrical circuit according to claim 13, wherein the switching means includes a Schottky diode.

15. An electrical circuit for receiving an input signal having a voltage, and producing an output signal, the circuit comprising:

(a) a plurality of inverters, each inverter including an enhancement-type FET and a depletion-type FET, the drain of the depletion-type FET being connected to a power source, the gate and source of the depletion-type FET being directly connected to each other and to the drain of the enhancement-type FET, the source of the enhancement-type FET being connected to ground, inverter input at the gate of the enhancement-type FET, an inverter output at the drain of the enhancement-type FET, and a logic threshold value, the inverters being serially connected together in a cascade;

(b) a feedback impedance, connecting the output of the last inverter in the cascade to the input of the first inverter in the cascade, wherein the feedback impedance includes first and second impedance elements each having a common connection in the circuit, the output signal appearing at the output of the last inverter in the cascade, further comprising a third impedance connected to the common connection and supplying a control voltage for controlling a duty ratio of the output signal to the common connection, wherein at least one of the first and second impedance elements include a variable resistor for adjusting sensitivity with respect to the control voltage; and (c) switching means connected between the input and output of the first inverter in the cascade for supplying a compensation current to the input of the first inverter when a voltage difference between the input and output of the first inverter exceeds a predetermined value, the compensation current compensating a disparity between the logic threshold value of the first inverter and the voltage of the input signal.

16. An electrical circuit for receiving an input signal having a voltage, and producing an output signal, the circuit comprising:

(a) a plurality of inverters, each inverter including an enhancement-type FET and a depletion-type FET, the drain of the depletion-type FET being connected to a power source, the gate and source of the depletion-type FET being directly connected to each other and to the drain of the enhancement-type FET, the source of the enhancement-type FET being connected to ground, inverter input at the gate of the enhancement-type FET, an inverter output at the drain of the enhancement-type FET, and a logic threshold value, the inverters being serially connected together in a cascade;

(b) a feedback impedance, connecting the output of the last inverter in the cascade to the input of the first inverter in the cascade, wherein the feedback impedance includes first and second impedance elements each having a common connection in the circuit, the output signal appearing at the output of the last inverter in the cascade, further comprising a third impedance connected to the common connection and supplying a control voltage for controlling a duty ratio of the output signal to the common connection, wherein a resistance value of the third impedance element is larger than a resistance value of the first impedance element, and is larger than a resistance value of the second impedance element; and (c) switching means connected between the input and output of the first inverter in the cascade for supplying a compensation current to the input of the first inverter when a voltage difference between the input and output of the first inverter exceeds a predetermined value, the compensation current compensating a disparity between the logic threshold value of the first inverter and the voltage of the input signal.

17. An electrical circuit for receiving an input signal having a voltage, and producing an output signal, the circuit comprising:

(a) a plurality of inverters, each inverter including an enhancement-type FET and a depletion-type FET, the drain of the depletion-type FET being connected to a power source, the gate and source of the depletion-type FET being directly connected to each other and to the drain of the enhancement-type FET, the source of the enhancement-type FET being connected to ground, inverter input at the gate of the enhancement-type FET, an inverter output at the drain of the enhancement-type FET, and a logic threshold value, the inverters being serially connected together in a cascade;

(b) a feedback impedance, connecting the output of the last inverter in the cascade to the input of the first inverter in the cascade, wherein the feedback impedance includes first and second impedance elements each having a common connection in the circuit, the output signal appearing at the output of the last inverter in the cascade, further comprising a third impedance connected to the common connection and supplying a control voltage for controlling a duty ratio of the output signal to the common connection, wherein one impedance element is connected to the first inverter in the cascade and another impedance element is connected to the last inverter in the cascade, and said one impedance element connected to the first inverter has a smaller value of resistance than said another impedance element connected to the last inverter; and (c) switching means connected between the input and output of the first inverter in the cascade for supplying a compensation current to the input of the first inverter when a voltage difference between the input and output of the first inverter exceeds a predetermined value, the compensation current compensating a disparity between the logic threshold value of the first inverter and the voltage of the input signal.

18. An electrical circuit for receiving an input signal having a voltage, and producing an output signal, the circuit comprising:

(a) a plurality of inverters, each inverter including an enhancement-type FET and a depletion-type FET, the drain of the depletion-type FET being connected to a power source, the gate and source of the depletion-type FET being directly connected to each other and to the drain of the enhancement-type FET, the source of the enhancement-type FET being connected to ground, inverter input at the gate of the enhancement-type FET, an inverter output at the drain of the enhancement-type FET, and a logic threshold value, the inverters being serially connected together in a cascade;

(b) a feedback impedance, connecting the output of the last inverter in the cascade to the input of the first inverter in the cascade, wherein the feedback impedance includes first, second and third impedance elements each having a common connection in the circuit, the output signal appearing at the output of the last inverter in the cascade, with the feedback impedance supplying a control voltage for controlling a duty ratio of the output signal to the common connection, wherein the first impedance element has a value of resistance greater than a value of resistance for the second impedance element; and (c) switching means connected between the input and output of the first inverter in the cascade for supplying a compensation current to the input of the first inverter when a voltage difference between the input and output of the first inverter exceeds a predetermined value, the compensation current compensating a disparity between the logic threshold value of the first inverter and the voltage of the input signal.

19. An electrical circuit for receiving an input signal having a voltage, and producing an output signal, the circuit comprising:

(a) a plurality of inverters, each inverter including an enhancement-type FET and a depletion-type FET, the drain of the depletion-type FET being connected to a power source, the gate and source of the depletion-type FET being directly connected to each other and to the drain of the enhancement-type FET, the source of the enhancement-type FET being connected to ground, inverter input at the gate of the enhancement-type FET, an inverter output at the drain of the enhancement-type FET, and a logic threshold value, the inverters being serially connected together in a cascade;

(b) a feed back impedance, connecting the output of the last inverter in the cascade to the input of the first inverter in the cascade; and (c) a compensation impedance, including at least one passive element, connected between the input and output of the first inverter in the cascade for supplying a compensation current to the input of the first inverter in accordance with a voltage applied to the compensation impedance, thereby compensating for a disparity between the logic threshold value of the first inverter and the voltage of the input signal.

20. An electrical circuit according to claim 19, wherein the compensation impedance includes a resistor.

* * * * *

UNITED STATES PATENT AND TRADEMARK OFFICE
CERTIFICATE OF CORRECTION

PATENT NO.   : 6,538,487 B2
DATED        : March 25, 2003
INVENTOR(S)  : Hidehisa Murayama et al.

It is certified that error appears in the above-identified patent and that said Letters Patent is hereby corrected as shown below:

<u>Title page,</u>
Item [73], change the Assignee to read -- Oki Electric Industry Co., Ltd. --

Signed and Sealed this

Thirtieth Day of December, 2003

JAMES E. ROGAN
*Director of the United States Patent and Trademark Office*